US011367832B2

(12) United States Patent
Hsu et al.

(10) Patent No.: US 11,367,832 B2
(45) Date of Patent: Jun. 21, 2022

(54) METHOD OF MAKING MAGNETORESISTIVE RANDOM ACCESS MEMORY DEVICE

(71) Applicant: TAIWAN SEMICONDUCTOR MANUFACTURING COMPANY, LTD., Hsinchu (TW)

(72) Inventors: Chern-Yow Hsu, Chu-Bei (TW); Shih-Chang Liu, Alian Township (TW); Chia-Shiung Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 99 days.

(21) Appl. No.: 16/779,256

(22) Filed: Jan. 31, 2020

(65) Prior Publication Data
US 2020/0168791 A1 May 28, 2020

Related U.S. Application Data

(62) Division of application No. 13/452,230, filed on Apr. 20, 2012, now Pat. No. 10,553,785.

(51) Int. Cl.
*H01L 43/08* (2006.01)
*H01L 43/12* (2006.01)
(Continued)

(52) U.S. Cl.
CPC ............ *H01L 43/08* (2013.01); *G11C 11/161* (2013.01); *H01L 27/222* (2013.01); *H01L 27/224* (2013.01); *H01L 43/12* (2013.01)

(58) Field of Classification Search
CPC ....... H01L 43/08; H01L 43/12; H01L 27/222; H01L 27/224; G11C 11/161
(Continued)

(56) References Cited

U.S. PATENT DOCUMENTS 7,595,520 B2   9/2009 Horng et al.
2006/0028865 A1* 2/2006 Kim ................ B82Y 40/00
                                                    365/173
(Continued)

FOREIGN PATENT DOCUMENTS

JP    2010-186869    8/2010

OTHER PUBLICATIONS

Office Action dated Jan. 23, 2014 and English translation from corresponding application No. KR 10-2012-0143413.

*Primary Examiner* — Lex H Malsawma
(74) *Attorney, Agent, or Firm* — Hauptman Ham, LLP

(57) ABSTRACT

A method of making a magnetoresistive random access memory (MRAM) device includes forming a bottom conductive layer. The method includes forming an anti-ferromagnetic layer over the bottom conductive layer and forming a tunnel layer over the anti-ferromagnetic layer. The method includes forming a free magnetic layer, having a magnetic moment aligned in a direction that is adjustable by applying an electromagnetic field, over the tunnel layer, wherein the anti-ferromagnetic layer, the tunnel layer and the free magnetic layer are part of a magnetic tunnel junction (MTJ) unit. The method includes forming a top conductive layer over the free magnetic layer. The method includes performing at least one lithographic process to remove portions of the bottom conductive layer, the MTJ unit and the top conductive layer that is uncovered by a photoresist layer. The method includes removing a portion of a sidewall of the MTJ unit.

20 Claims, 4 Drawing Sheets

(51) Int. Cl.
 *G11C 11/16* (2006.01)
 *H01L 27/22* (2006.01)
(58) Field of Classification Search
 USPC ............... 257/421, E27.005, E43.001; 438/3
 See application file for complete search history.

(56) References Cited

U.S. PATENT DOCUMENTS

| | | |
|---|---|---|
| 2007/0148557 A1* | 6/2007 | Takei ................ H01L 21/02183 430/4 |
| 2010/0102404 A1 | 4/2010 | Li et al. |
| 2010/0200900 A1 | 8/2010 | Iwayama |
| 2011/0272380 A1* | 11/2011 | Jeong ...................... H01L 43/12 216/22 |
| 2012/0032288 A1 | 2/2012 | Tomioka |

* cited by examiner

METHOD OF MAKING MAGNETORESISTIVE RANDOM ACCESS MEMORY DEVICE

RELATED APPLICATION

This application is a divisional application of U.S. application Ser. No. 13/452,230, filed Apr. 20, 2012, which is hereby incorporated by reference in its entirety.

BACKGROUND

The present disclosure relates generally to magnetoresistive random access memory (MRAM), and more particularly to MRAM cells having magnetic tunnel junction (MTJ) units with continuous tunnel layers.

MRAM is a type of memory device containing an array of MRAM cells that store data using resistance values instead of electronic charges. Each MRAM cell includes a magnetic tunnel junction (MTJ) unit whose resistance can be adjusted to represent a logic state "0" or "1." MTJ is a critical component of an MRAM device and the formation of an MTJ is important to any MRAM product.

Conventionally, the MTJ unit is comprised of a fixed magnetic layer, a free magnetic layer, and a tunnel layer disposed there between. The resistance of the MTJ unit can be adjusted by changing a direction of a magnetic moment of the free magnetic layer with respect to that of the fixed magnetic layer. When the magnetic moment of the free magnetic layer is parallel to that of the fixed magnetic layer, the resistance of the MTJ unit is low, whereas when the magnetic moment of the free magnetic layer is anti-parallel to that of the fixed magnetic layer, the resistance of the MTJ unit is high. The MTJ unit is coupled between top and bottom electrodes, and an electric current flowing through the MTJ from one electrode to another can be detected to determine the resistance, and therefore the logic state of the MTJ.

FIG. 1 is a cross-sectional view of a typical MRAM cell 100 comprised of a MTJ unit 102 coupled to a bit line 104 through a top electrode 106, and to a source/drain doped region 108 of a MOS device 116 through a bottom electrode 110 and a contact 112. A write line 114 is located underneath the MTJ unit 102 for generating an electromagnetic field to change the resistance of the MTJ unit 102 during a write operation. During a read operation, the MOS device 116 is selected to pass a current through the bit line 104, the top electrode 106, the MTJ unit 102, the bottom electrode 110, and the contact 112 to a source/drain doped region 118. A current detected at the bit line 104 is compared with a reference to determine whether the resistance of the MTJ unit 102 represents a high or low state. Because MRAM does not utilize electric charges for data storage, MRAM consumes less power and suffers less from current leakage than other types of memory, such as static random access memory (SRAM), dynamic random access memory (DRAM) and flash memory.

FIGS. 2-4 are cross-sectional views of a MTJ unit during a fabrication process. Referring to FIG. 2, a stack of a bottom conductive layer 202, an anti-ferromagnetic layer 204, a pinned layer 206, a tunnel layer 208, a free magnetic layer 210 and a top conductive layer 212 is formed above a semiconductor substrate (not shown in the figure). The anti-ferromagnetic layer 204 fixes a magnetic moment of the pinned layer 206 in one direction, a magnetic moment of the free magnetic layer 210 can be changed by applying external electromagnetic forces. A photoresistor layer 214 is formed on the top conductive layer 212 to define a width of the MTJ unit being fabricated.

An etching processing using the photoresistor layer 214 as a mask is performed to remove parts of the top conductive layer 212 not covered by the photoresistor layer 214. The photoresistor layer 214 is then stripped after the etching process reaches a top surface of the free magnetic layer 210, resulting in a structure as depicted in FIG. 3.

Another etching process, preferably dry etching, is performed using the top conductive layer 212 as a hard mask to remove portions of the free magnetic layer 210, the tunnel layer 208, the pinned layer 206 and the anti-ferromagnetic layer 204 not covered by the top conductive layer 212 in order to separate a MTJ unit from its neighboring units. The etching process stops when at a top surface of the bottom conductive layer 202, resulting in a structure as depicted in FIG. 4.

One drawback of the conventional etching process used in forming the MTJ unit is that the MTJ unit is susceptible to a short circuit reliability issue. The etching process is often performed in a chamber where plasma is introduced to bombard a surface of the MTJ unit being fabricated. As a result, there may be residual conductive materials remaining on sidewalls of the completed MTJ unit as depicted in FIG. 4. These residual conductive materials may conduct a current between the bottom conductive layer 202 and the top conductive layer 212 bypassing the tunnel layer 208, thereby causing the MTJ unit to fail.

Another drawback of the conventional etching process used in forming the MTJ unit is that the top conductive layer 212 and the photoresistor layer 214 are thick. The MTJ unit is relatively deep for purposes of etching as it is comprised of layers including the free magnetic layer 210, the tunnel layer 208, the pinned layer 206, and the anti-ferromagnetic layer 204. Because the top conductive layer 212 acts as a hard mask the top conductive layer 212 is consumed during the etching process. The top conductive layer 212 is sufficiently thick to ensure that enough of the top conductive layer 212 will remain on the free magnetic layer 210 after the etching. Likewise, the photoresistor layer 214 is sufficiently thick to ensure that enough of the photoresistor layer 214 will remain on the top conductive layer 212 after etching. This poses a challenge to MRAM fabrication, especially when MRAM continues to shrink in size beyond 45 nm of conductor width.

Yet another drawback of the conventional etching process in forming the MTJ unit is that the top surface of the top conductive layer 212 may become rounded by the etching, thereby increasing the difficulty of forming a contact thereon. During the etching process, the corners of the top conductive layer 212 are etched faster than other parts. As a result, properly forming a contact on the conductive layer 212 is more difficult, and thus increases reliability issues.

As such, what is needed is a method of fabricating MRAM that addresses the short circuit and mask thickness issues present in the conventional process.

SUMMARY

The present disclosure is directed to MRAM technology. One embodiment includes a method for fabricating a magnetoresistive random access memory (MRAM) device having a plurality of memory cells. The method includes forming a fixed magnetic layer having magnetic moments fixed in a predetermined direction; forming a tunnel layer over the fixed magnetic layer; forming a free magnetic layer, having magnetic moments aligned in a direction that is adjustable by applying an electromagnetic field, over the tunnel layer; forming a hard mask on the free magnetic layer partially covering the free magnetic layer; and unmagnetizing portions of the free magnetic layer uncovered by the hard mask for defining one or more magnetic tunnel junction (MTJ) units.

The construction and method of operation together with additional objectives and advantages thereof will be best understood from the following description of specific embodiments when read in connection with the accompanying drawings.

DESCRIPTION

This disclosure is directed to a method of fabricating a MRAM device. The following merely illustrates various embodiments of the present invention for purposes of explaining the principles thereof. It is understood that those skilled in the art will be able to devise various equivalents that, although not explicitly described herein, embody the principles of this invention.

Figure 1:
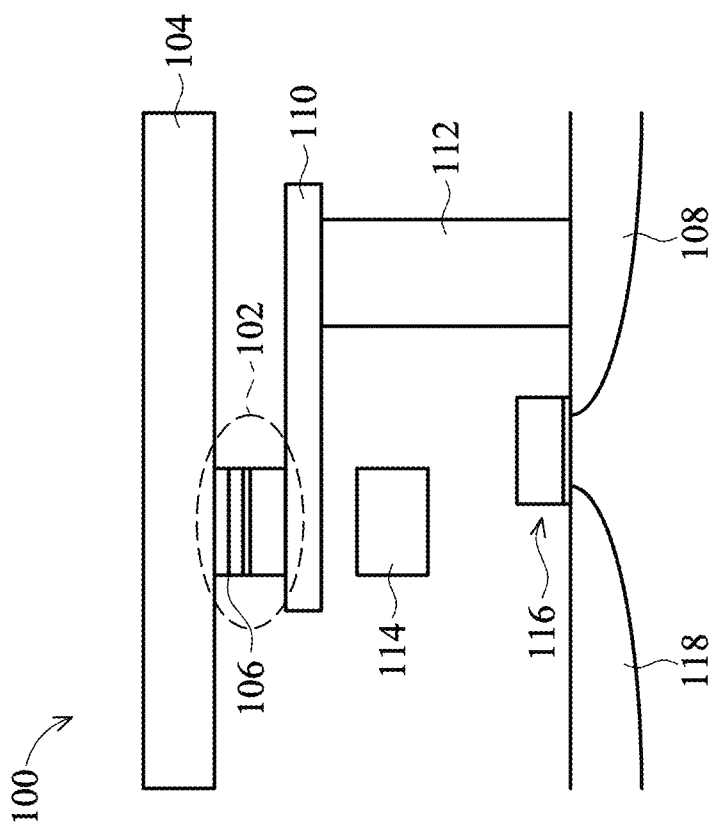
FIG. 1 is a cross-sectional view of a typical MRAM cell.
Figure 4:
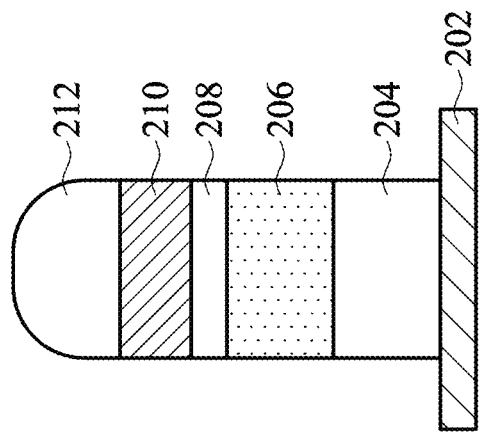
FIGS. 2-4 are cross-sectional views of an MTJ unit during a conventional fabrication process.
Figure 3:
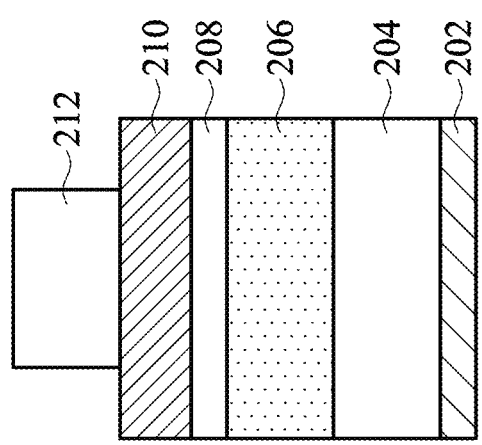
Figure 2:
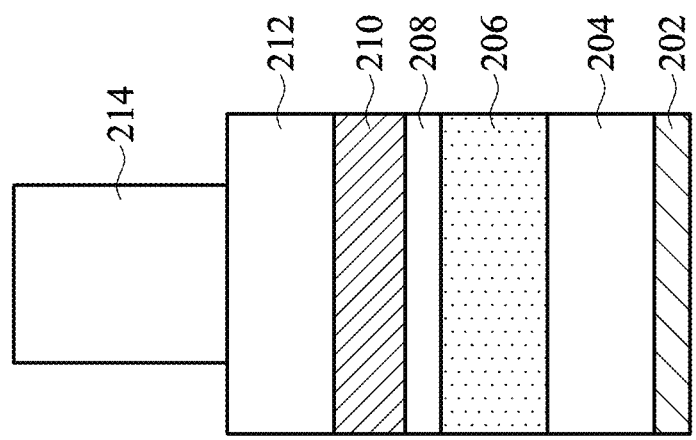
Figure 7:
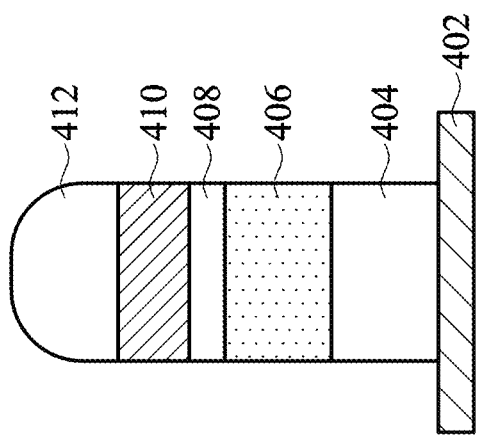
FIGS. 5-7 are cross-sectional views of an MTJ unit during a fabrication process in accordance with at least one embodiment.
Figure 6:
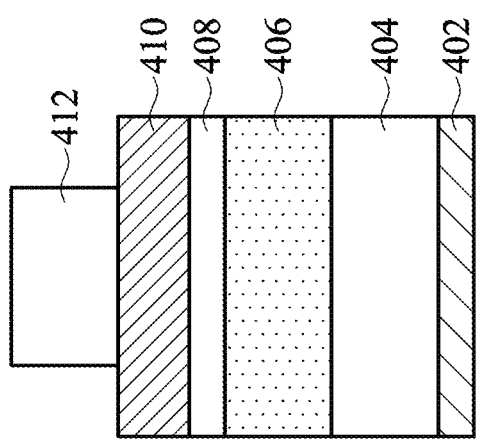
Figure 5:
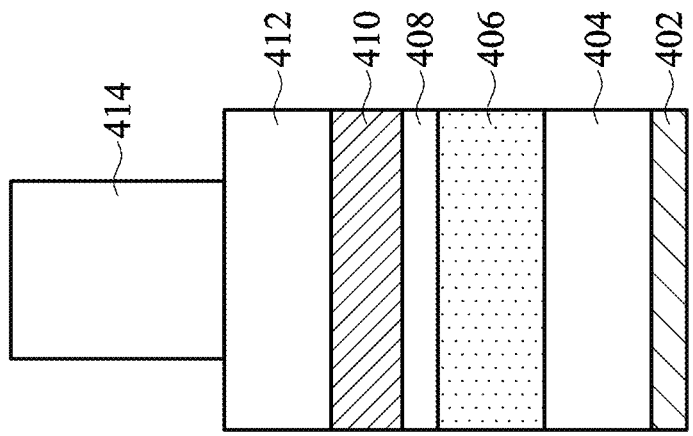

FIGS. 5-7 are cross-sectional views of an MTJ unit during a fabrication process of a MRAM device in accordance with at least one embodiment. Referring to FIG. 5, a stack of a bottom conductive layer 402, an anti-ferromagnetic layer 404, a pinned layer 406, a tunnel layer 408, a free magnetic layer 410 and a top conductive layer 412 is formed above a semiconductor substrate (not shown in the figure). The anti-ferromagnetic layer 404 fixes a magnetic moment of the pinned layer 406 in one direction, whereas a magnetic moment of the free magnetic layer 410 can be changed by applying external electromagnetic forces. A photoresistor layer 414 is formed on the top conductive layer 412 to define a width of the MTJ unit.

The stack of bottom conductive layer 402, anti-ferromagnetic layer 404, pinned layer 406, tunnel layer 408, free magnetic layer 410 and top conductive layer 412 can be formed by semiconductor processing technology such as chemical vapor deposition (CVD); plasma enhanced chemical vapor deposition (PECVD), sputtering, or electroplating. The top and bottom conductive layers 412 and 402 contain materials, such as tantalum, aluminum, copper, titanium, tungsten, TiN, or TaN. The tunnel layer contains, for example, $Al_2O_3$, MgO, TaOx, or HfO. The photoresistor layer 414 can be formed by photolithography including photoresistor coating, exposing, baking, and developing.

A reactive ion etching is performed using carbon tetrafluoride as reactants to remove portions of the top conductive layer 412 not covered by the photoresistor layer 414 until the free magnetic layer 410 underlying the top conductive layer 412 is exposed. The photoresistor layer 414 is then removed resulting in a structure as depicted in FIG. 6. Thereafter, another etching process is conducted, using the top conductive layer 412 as a hard mask, to remove portions of the free magnetic layer 410, the tunnel layer 408, the pinned layer 406, the anti-ferromagnteic layer 404, until the bottom conductive layer 402 is exposed. This second etching process forms an MTJ unit that is depicted in FIG. 7.

Figure 8:
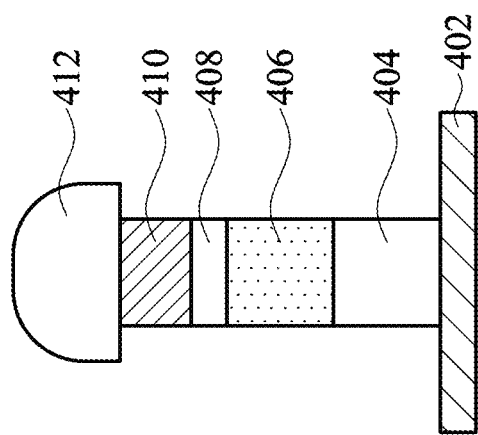

Referring to FIG. 8, a sidewall-removal process is performed to remove portions of sidewalls of the MTJ unit between the top conductive layer 412 and the bottom conductive layer 402. The removal of the MTJ sidewalls can be done using a dry etching process, such as a plasma etching process. The removal of the MTJ sidewalls can also be done using a wet etching method.

Various dry etching processes involving the use of gaseous plasmas are known. In at least one embodiment, for example, the MTJ unit is dry etched by using plasma containing a gas comprising fluorine. In at least one embodiment, the plasma etching uses a gas mixture comprising sulfur hexafluoride (SF6), oxygen (O2)m and trifluoromethane (CHF3). A similar gas mixture containing these three reactant gases has been used for etching polysilicon in a decoupled plasma source (DPS) reactor, manufactured by Applied Materials, Inc., of Santa Clara, Calif. The plasma gas in at least one embodiment comprises a gas mixture of fluoride (such as CFHx, SFx), Argon, alcohol (such as methanol), nitrogen, hydrogen, and oxygen. In at least one embodiment, the Argon gas flow rates for the main etch step is between 20 to 100 sccm. A suitable radio frequency with a power of about between 100 to 500 W is applied. The plasma chamber pressure is maintained at approximately 3 to 20 mTorr. In at least one embodiment, the nitrogen gas flow rate is between 50 to 200 sccm; the power is set at between 300 to 3000 W, and the plasma chamber pressure is maintained at approximately 2 to 30 mTorr.

In addition to plasma etching, other dry etching methods can be used as well. For example, ion beam etching is another dry etching option that can be used to remove MTJ sidewalls. One such method, known as ion milling, is described here as an example. Wafers are placed on a holder in a vacuum chamber and a stream of argon gas is introduced into the chamber. Upon entering the chamber, the argon is subjected to a stream of high-energy electrons from a set of cathode and anode electrodes. The electrons ionize the argon atoms to a high-energy state having a positive charge. The wafers are held on a negatively biased holder that attracts the positive argon ions. As the argon ions travel to the wafer holder the argon ions accelerate, picking up energy. At the wafer surface the argon ions crash into the exposed wafer layer and remove small amounts of material from a wafer surface. During this process, no chemical reaction occurs between the argon ions and the wafer material. Material removal (etching) using ion milling is highly directional.

In addition to dry etching, the MTJ sidewall material can also be removed by using a wet etching process. In some embodiments, inorganic cleaning solutions, such as HF, APM, SPM, HNO3 or acetic acid can be used as wet etchants. For example, a concentration of a wet etchant chemical, such as HF, can be from about 0.02% to about 1%. And an operating temperature for the wet etching process can be from 20 to 60 Celsius. The wet etching process can also be conducing as a solvent cleaning solution. In at least one embodiment, the solvent cleaning solution comprises of a mixture of a surfactant, a chelating agent, an inhibitor and water.

FIG. 8 depicts the resultant MTJ unit after a portion of the sidewalls has been removed by the etching processes described above. As FIG. 8 depicts, after the damaged portion of the MTJ sidewall has been removed, the diameter of the portion of the MTJ unit below the top conductive layer 412 is smaller than the diameter of the conductive layer 412.

Figure 9:
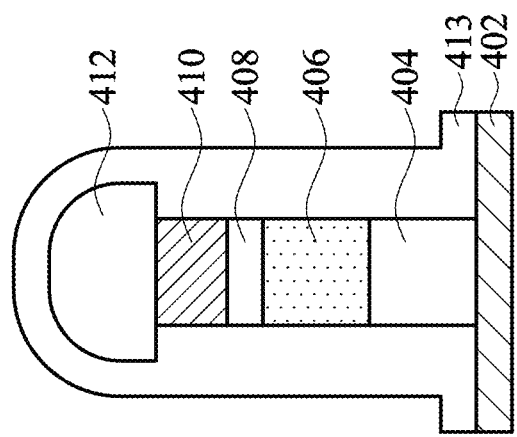
FIG. 8 and FIG. 9 are cross-sectional views of two neighboring MRAM cells fabricated in accordance with at least one embodiment.

FIG. 9 is a cross-sectional view of the MTJ unit after a capping later 413 is placed encapsulating the MTJ unit. In at least one embodiment, the capping layer 413 is made of NiFeHf and has a thickness from about 15 to 50 Angstroms. In some embodiments, the capping layer has a thickness of 45 Angstroms. By employing the capping layer 413 comprised of a NiFeHf layer that contacts the conductive layer 412, the conductive layer 412 is less oxygen contaminated and has higher conductivity, thereby improving micro-electromechanical system (MEMS) resistance ratio ΔR/R. The oxygen gettering capability of NiFeHf is achieved because Hf has a higher oxidation potential than Ni and Fe in the top conductive layer 412. Another benefit of a NiFeHf capping layer 413 is that a "dead layer" between the top conductive layer 412 and the capping layer 413 is substantially eliminated. The "dead layer" is a 3 to 6 Angstrom thick interface between the top conductive layer 412 and the capping layer 413 wherein some intermixing of layers has occurred. For example, in conventional Ru or Ta capping layers, Ru and Ta may migrate into a NiFe free layer and thereby reduce the magnetic moment of the free layer and dR/R of the MTJ. The "dead layer" is indicative of poor lattice matching between the free layer and adjoining the capping layer. By reducing the dead layer and thereby increasing the effective volume of the free layer, the NiFeHf layer promotes a more thermally stable device since volume of the free layer is directly related to the thermal stability factor. In at least one embodiment, the capping layer 413 can be made from other NiFeM materials, where M is a metal such as Zr or Nb that has an oxidation potential greater tan that of Ni and Fe.

In at least one embodiment, the capping layer 413 may be a composite layer having a NiFeHf layer that contacts the NiFe free layer, and one or more other layers formed on the NiFeHf layer. In at least one embodiment, the capping layer 413 may have a NiFeHf/Ta configuration. Optionally, the capping layer 413 may have a configuration represented by NiFeHf/Ta/Ru. In at least one embodiment, a thickness of the Ta layer may vary from 10 to 50 Angstroms, and a thickness of the Ru layer may vary from 30 to 100 Angstroms. Optionally, other elements such as Zr or Nb that have a higher oxidation potential than Ni and Fe may be incorporated in a NiFeM/Ta capping layer configuration.

After all of the MTJ layers have been formed, a hard mask having a thickness of from 400 to 600 Angstroms is deposited on the capping layer 413 in the same sputter deposition tool. In some embodiments, the hard mask has a thickness of 500 Angstroms. In at least one embodiment, a Ta hard mask is formed on the NiFeHf capping layer 413.

One advantage of the method for fabricating the MRAM devices is that the reliability of the memory structure resulted from such method can be improved as opposed to the structure made by the conventional manufacturing process. As discussed above, the method eliminates the etching process during the construction of MTJ units, and therefore avoids the material residue problem that is often seen on the sidewalls of the MTJ units made by conventional methods. This eliminates the short circuit problems for MTJ units, and therefore improves the reliability of the MRAM devices.

The above disclosure provides many different embodiments or embodiments for implementing different features of the invention. Specific embodiments of components and processes are described to help clarify the invention. These are, of course, merely embodiments and are not intended to limit the invention from that described in the claims.

An aspect of this description relates to a method of making a magnetoresistive random access memory (MRAM) device. The method includes forming a bottom conductive layer. The method further includes forming an anti-ferromagnetic layer. The method further includes forming a tunnel layer over the bottom conductive layer and the anti-ferromagnetic layer. The method further includes forming a free magnetic layer, having a magnetic moment aligned in a direction that is adjustable by applying an electromagnetic field, over the tunnel layer, wherein the anti-ferromagnetic layer, the tunnel layer and the free magnetic layer are part of a magnetic tunnel junction (MTJ) unit. The method further includes forming a top conductive layer over the free magnetic layer. The method further includes performing at least one lithographic process to remove portions of the bottom conductive layer, the anti-ferromagnetic layer, the tunnel layer, the free magnetic layer and the top conductive layer that is uncovered by a photoresist layer until the bottom conductive layer is exposed. The method further includes removing a portion of a sidewall of the MTJ unit. In some embodiments, the method further includes forming a capping layer, after the portion of the sidewall of the MTJ unit is removed, on the MTJ unit to encapsulate the MTJ unit. In some embodiments, the method further includes forming a hard mask over the capping layer. In some embodiments, forming the capping layer includes forming the capping layer having a thickness ranging from about 15 angstroms (Å) to about 50 Å. In some embodiments, forming the capping layer includes forming the capping layer directly contacting a bottom surface of the top conductive layer. In some embodiments, removing the portion of the sidewall of the MTJ unit includes using a dry etching process. In some embodiments, removing the portion of the sidewall of the MTJ unit includes using a wet etching process. In some embodiments, the method further includes forming a pinned layer over the anti-ferromagnetic layer, wherein the pinned layer is part of the MTJ unit. In some embodiments, removing the portion of the sidewall of the MTJ unit includes undercutting the top conductive layer.

An aspect of this description relates to a method of making a magnetoresistive random access memory (MRAM) device. The method includes depositing an anti-ferromagnetic layer over a first conductive layer. The method further includes depositing a pinned layer over the anti-ferromagnetic layer. The method further includes depositing a tunnel layer over the pinned layer. The method further includes depositing a free magnetic layer over the tunnel layer. The method further includes depositing a second conductive layer over the free magnetic layer. The method further includes patterning the anti-ferromagnetic layer, the pinned layer, the tunnel layer, the free magnetic layer and the second conductive layer to have aligned sidewalls. The method further includes etching the anti-ferromagnetic layer, the pinned layer, the tunnel layer and the free magnetic layer to have sidewalls recessed with respect to sidewalls of the second conductive layer. The method further includes depositing a capping layer along the recessed sidewalls of the anti-ferromagnetic layer, the pinned layer, the tunnel layer and the free magnetic layer. In some embodiments, depositing the capping layer includes encapsulating the second conductive layer. In some embodiments, patterning the second conductive layer includes forming a curved top surface of the second conductive layer. In some embodiments, depositing the second conductive layer includes depositing the second conductive layer selected form the group consisting of tantalum, aluminum, copper, titanium, tungsten, TiN and TaN. In some embodiments, depositing the tunnel layer comprises depositing the tunnel layer comprising Al$_2$O$_3$, MgO, TaO$_x$ or HfO. In some embodiments, patterning the second conductive layer includes performing a reactive ion etching. In some embodiments, etching the anti-ferromagnetic layer, the pinned layer, the tunnel layer and the free magnetic layer includes performing a plasma etching process.

An aspect of this description relates to a method of making a magnetoresistive random access memory (MRAM) device. The method includes depositing a magnetic tunnel junction (MTJ) unit over a first conductive layer, wherein the MTJ unit includes an anti-ferromagnetic layer, a pinned layer, a tunnel layer and a free magnetic layer. The method further includes depositing a second conductive layer over the MTJ unit. The method further includes depositing a photoresist over the second conductive layer. The method further includes patterning the photoresist. The method further includes etching the second conductive layer using the patterned photoresist. The method further includes removing the patterned photoresist. The method further includes etching the MTJ unit using the etched second conductive layer. The method further includes recessing sidewalls of the etched MTJ unit. The method further includes depositing a capping layer along the recessed sidewalls of the etched MTJ unit. In some embodiments, etching the MTJ unit includes using a gas mixture comprising sulfur hexafluoride, oxygen and trifluoromethane. In some embodiments, etching the MTJ unit includes using a gas mixture comprising a fluoride, argon, an alcohol, nitrogen, hydrogen and oxygen. In some embodiments, etching the MTJ unit includes using an ion beam etching process.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method of making a magnetoresistive random access memory (MRAM) device, the method comprising:
    forming a bottom conductive layer;
    forming an anti-ferromagnetic layer;
    forming a tunnel layer over the bottom conductive layer and the anti-ferromagnetic layer;
    forming a free magnetic layer, having a magnetic moment aligned in a direction that is adjustable by applying an electromagnetic field, over the tunnel layer, wherein the anti-ferromagnetic layer, the tunnel layer and the free magnetic layer are part of a magnetic tunnel junction (MTJ) unit;
    forming a top conductive layer over the free magnetic layer;
    performing at least one lithographic process to remove portions of the bottom conductive layer, the anti-ferromagnetic layer, the tunnel layer, the free magnetic layer and the top conductive layer that is uncovered by a photoresist layer until the bottom conductive layer is exposed; and
    removing a portion of a sidewall of the MTJ unit along the entirety of the MTJ unit in a height direction after performing the at least one lithographic process.

2. The method of claim 1, further comprising forming a capping layer, after the portion of the sidewall of the MTJ unit is removed, on the MTJ unit to encapsulate the MTJ unit.

3. The method of claim 2, further comprising forming a hard mask over the capping layer.

4. The method of claim 2 wherein forming the capping layer comprises forming the capping layer having a thickness ranging from about 15 angstroms (A) to about 50 A.

5. The method of claim 2, wherein forming the capping layer comprises forming the capping layer directly contacting a bottom surface of the top conductive layer.

6. The method of claim 1, wherein removing the portion of the sidewall of the MTJ unit comprises using a dry etching process.

7. The method of claim 1, wherein removing the portion of the sidewall of the MTJ unit comprises using a wet etching process.

8. The method of claim 1, further comprising forming a pinned layer over the anti-ferromagnetic layer, wherein the pinned layer is part of the MTJ unit.

9. The method of claim 1, wherein removing the portion of the sidewall of the MTJ unit comprises undercutting the top conductive layer.

10. A method of making a magnetoresistive random access memory (MRAM) device, the method comprising:
    depositing an anti-ferromagnetic layer over a first conductive layer;
    depositing a pinned layer over the anti-ferromagnetic layer;
    depositing a tunnel layer over the pinned layer;
    depositing a free magnetic layer over the tunnel layer;
    depositing a second conductive layer over the free magnetic layer;
    patterning the anti-ferromagnetic layer, the pinned layer, the tunnel layer, the free magnetic layer and the second conductive layer to have aligned sidewalls;
    etching the anti-ferromagnetic layer, the pinned layer, the tunnel layer and the free magnetic layer to have sidewalls of each of the anti-ferromagnetic layer, the pinned layer, the tunnel layer and the free magnetic layer recessed with respect to sidewalls of the second conductive layer;
    depositing a capping layer along the recessed sidewalls of the anti-ferromagnetic layer, the pinned layer, the tunnel layer and the free magnetic layer.

11. The method of claim 10, wherein depositing the capping layer comprises encapsulating the second conductive layer.

12. The method of claim 10, wherein patterning the second conductive layer comprises forming a curved top surface of the second conductive layer.

13. The method of claim 10, wherein depositing the second conductive layer comprises depositing the second conductive layer selected from the group consisting of tantalum, aluminum, copper, titanium, tungsten, TiN and TaN.

14. The method of claim 10, wherein depositing the tunnel layer comprises depositing the tunnel layer comprising Al$_2$O$_3$, MgO, TaO$_x$, or HfO.

15. The method of claim 10, wherein patterning the second conductive layer comprises performing a reactive ion etching.

16. The method of claim 10, wherein etching the anti-ferromagnetic layer, the pinned layer, the tunnel layer and the free magnetic layer comprises performing a plasma etching process.

17. A method of making a magnetoresistive random access memory (MRAM) device, the method comprising:
  depositing a magnetic tunnel junction (MTJ) unit over a first conductive layer, wherein the MTJ unit comprises an anti-ferromagnetic layer, a pinned layer, a tunnel layer and a free magnetic layer;
  depositing a second conductive layer over the MTJ unit;
  depositing a photoresist over the second conductive layer;
  patterning the photoresist;
  etching the second conductive layer using the patterned photoresist;
  removing the patterned photoresist;
  etching the MTJ unit using the etched second conductive layer;
  recessing sidewalls of the etched MTJ unit; and
  depositing a capping layer directly contacting the recessed sidewalls of the etched MTJ unit and a top-most surface of the second conductive layer.

18. The method of claim 17, wherein etching the MTJ unit comprises using a gas mixture comprising sulfur hexafluoride, oxygen and trifluoromethane.

19. The method of claim 17, wherein etching the MTJ unit comprises using a gas mixture comprising a fluoride, argon, an alcohol, nitrogen, hydrogen and oxygen.

20. The method of claim 17, wherein etching the MTJ unit comprises using an ion beam etching process.

* * * * *